United States Patent
So et al.

(10) Patent No.: US 11,658,410 B2
(45) Date of Patent: May 23, 2023

(54) APPARATUS AND METHOD FOR SYNCHRONIZING POWER CIRCUITS WITH COHERENT RF SIGNALS TO FORM A STEERED COMPOSITE RF SIGNAL

(71) Applicant: Epirus, Inc., El Segundo, CA (US)

(72) Inventors: Yiu Man So, El Segundo, CA (US); Michael Borisov, El Segundo, CA (US); Daniel G. Thompson, El Segundo, CA (US); Alex Scott, El Segundo, CA (US); Nathan Mintz, El Segundo, CA (US); Max Mednik, El Segundo, CA (US); Ryan Ligon, El Segundo, CA (US); Harry B. Marr, El Segundo, CA (US)

(73) Assignee: Epirus, Inc., Hawthorne, CA (US)

(*) Notice: Subject to any disclaimer, the term of this patent is extended or adjusted under 35 U.S.C. 154(b) by 390 days.

(21) Appl. No.: 16/779,036

(22) Filed: Jan. 31, 2020

(65) Prior Publication Data

US 2021/0057813 A1 Feb. 25, 2021

Related U.S. Application Data

(60) Provisional application No. 62/817,096, filed on Mar. 12, 2019.

(51) Int. Cl.
| | |
|---|---|
| *H03F 1/07* | (2006.01) |
| *H01Q 3/28* | (2006.01) |
| *G01S 7/03* | (2006.01) |
| *H01Q 3/38* | (2006.01) |
| *H03F 3/68* | (2006.01) |
| *H03F 1/02* | (2006.01) |
| *H03F 1/56* | (2006.01) |

(52) U.S. Cl.
CPC ............... *H01Q 3/28* (2013.01); *G01S 7/032* (2013.01); *H01Q 3/38* (2013.01); *H03F 1/0222* (2013.01); *H03F 1/56* (2013.01); *H03F 3/68* (2013.01)

(58) Field of Classification Search
CPC .................................... H03F 1/07; H03F 1/02
USPC ..................................... 330/124 R, 129, 295
See application file for complete search history.

(56) References Cited

U.S. PATENT DOCUMENTS

| | | |
|---|---|---|
| 3,562,741 A | 2/1971 | McEvoy |
| 4,430,577 A | 2/1984 | Bouquet |
| 5,164,689 A | 11/1992 | Plonka |
| 5,426,641 A | 6/1995 | Afrashteh et al. |
| 5,880,648 A | 3/1999 | Aves |
| 6,362,449 B1 | 3/2002 | Hadidi |
| 6,756,843 B2 | 6/2004 | Charley et al. |

(Continued)

OTHER PUBLICATIONS

International Search Report and Written Opinion dated Jun. 9, 2020 for PCT Application No. PCT/US2020/021895, 7 pages.

(Continued)

*Primary Examiner* — Henry Choe
(74) *Attorney, Agent, or Firm* — Knobbe, Martens, Olson & Bear, LLP

(57) ABSTRACT

An apparatus has a Radio Frequency (RF) signal generator to produce RF signals phase shifted relative to one another in accordance with RF frequency waveform parameters. Amplifier chains process the RF signals to produce channels of amplified RF signals. Each amplifier chain has amplifiers and at least one amplifier has a tunable gate voltage synchronized with the RF signals.

25 Claims, 7 Drawing Sheets

(56) References Cited

U.S. PATENT DOCUMENTS

| | | |
|---|---|---|
| 7,242,518 B1 | 7/2007 | Lynch |
| 7,256,650 B1 | 8/2007 | Stockert |
| 7,388,433 B1 | 6/2008 | Hecht |
| 7,479,691 B2 | 1/2009 | Ewe |
| 7,508,338 B2 | 3/2009 | Pluymers |
| 7,603,088 B2 | 10/2009 | Ammar |
| 7,948,318 B2 | 5/2011 | Hongo |
| 8,712,344 B2 | 4/2014 | Wang |
| 8,718,580 B2 | 5/2014 | Borodulin |
| 8,737,527 B2 * | 5/2014 | Lozhkin ............... H03F 1/0277 375/295 |
| 8,737,531 B2 * | 5/2014 | Saunders .............. H03H 11/20 375/295 |
| 8,760,634 B2 * | 6/2014 | Rose ..................... G01S 17/90 356/3.01 |
| 9,065,163 B1 | 6/2015 | Wu |
| 9,111,949 B2 | 8/2015 | Yu |
| 9,455,695 B2 | 9/2016 | Kull et al. |
| 9,518,554 B2 * | 12/2016 | Mongin ............... H03G 3/3042 |
| 9,548,880 B2 * | 1/2017 | Hori .................... H04L 27/3405 |
| 9,825,593 B2 * | 11/2017 | de Vreede ............ H03F 3/72 |
| 9,984,996 B2 | 5/2018 | Lu |
| 10,224,184 B2 * | 3/2019 | Van Zyl ............. H01J 37/32146 |
| 10,289,184 B2 | 5/2019 | Malik et al. |
| 10,304,669 B1 | 5/2019 | Coumou |
| 10,355,770 B2 | 7/2019 | Gharavi et al. |
| 10,705,556 B2 * | 7/2020 | Kapur .................. G06F 1/0321 |
| 10,791,015 B2 | 9/2020 | Mochizuki |
| 10,938,347 B2 | 3/2021 | Rofougaran |
| 10,958,323 B1 | 3/2021 | Benyishay |
| 11,005,514 B2 | 5/2021 | Cordier |
| 11,012,120 B2 | 5/2021 | Guillot |
| 11,094,507 B2 | 8/2021 | Funk |
| 11,158,942 B1 | 10/2021 | Scott |
| 11,211,703 B2 | 12/2021 | Marr |
| 11,283,305 B2 | 3/2022 | Adachi et al. |
| 11,469,722 B2 | 10/2022 | Kultran et al. |
| 11,522,286 B2 | 12/2022 | Marr, Jr. et al. |
| 2003/0227330 A1 | 12/2003 | Khanifar |
| 2006/0049870 A1 | 3/2006 | Hellberg |
| 2008/0153435 A1 | 6/2008 | Hirano |
| 2008/0297414 A1 | 12/2008 | Krishnaswamy |
| 2010/0237884 A1 | 9/2010 | Bult et al. |
| 2011/0054271 A1 | 3/2011 | Derchak |
| 2011/0156813 A1 | 6/2011 | Kim et al. |
| 2012/0200281 A1 | 8/2012 | HerbSommer |
| 2013/0120190 A1 * | 5/2013 | McCune, Jr. .......... H01Q 3/30 342/368 |
| 2014/0266460 A1 | 9/2014 | Nobbe et al. |
| 2015/0061769 A1 | 3/2015 | Bodnar |
| 2015/0270806 A1 | 9/2015 | Wagh et al. |
| 2016/0036113 A1 | 2/2016 | Wu |
| 2016/0049909 A1 | 2/2016 | Scherrer |
| 2016/0127060 A1 | 5/2016 | Cross |
| 2016/0282450 A1 | 9/2016 | Kishigami |
| 2017/0180011 A1 | 6/2017 | Charvat et al. |
| 2017/0359033 A1 | 12/2017 | Bazzani |
| 2018/0131102 A1 | 5/2018 | Wang |
| 2019/0058448 A1 | 2/2019 | Seebacher |
| 2020/0036334 A1 | 1/2020 | Witt |
| 2020/0054271 A1 | 2/2020 | Zerial et al. |
| 2020/0395894 A1 | 12/2020 | Esmael |
| 2021/0057813 A1 | 2/2021 | So |
| 2021/0399695 A1 | 12/2021 | Kultran |
| 2021/0399700 A1 | 12/2021 | Kultran et al. |
| 2022/0045423 A1 | 2/2022 | Scott |
| 2022/0115782 A1 | 4/2022 | Marr |
| 2022/0158346 A1 | 5/2022 | Marr |
| 2022/0271569 A1 | 8/2022 | Marr, Jr. et al. |
| 2022/0286097 A1 | 9/2022 | Kultran et al. |

OTHER PUBLICATIONS

Ampleon AN11226 ITTL Bias Switching Application Note, Revision 2 (2015).

Barsegyan, et al., Bias Sequencing and Gate Pulsing Circuit for GaN Amplifier (2015).

Delos, et al., Rarely Asked Questions—Issue 148 Unique Gate Drive Applications Enable Rapidly Switching On/Off for Your High Power Amplifier, Analog Dialog 51-12 (2017).

Gold, et al., Review of high-power microwave source resource, Review of Scientific Instruments 68:3945 (1997).

Korovin, et al., Pulsed Power-Driven High-Power Microwave Sources, Proceedings of the IEEE 92(7):1082-1095 (2004).

Manh, et al., An Independently Biased 3-stack GaN HEMT Configuration for 5G Mobile Networks (2019).

Pajic, et al., X-Band Two-Stage High-Efficiency Switched-Mode Power Amplifiers, IEEE Transactions on Microwave Theory and Techniques, 53(9):2899-2907 (2005).

Schafer, et al., X-Band MMIC GaN Power Amplifiers Designed for High-Efficiency Supply-Modulated Transmitters (2013).

Sheppard, et al., High-Power Microwave GaN/AlGaN HEMT's on Semi-Insulating Silicon Carbide Substrates, IEEE Electron Device Letters, 20(4):161-163 (1999).

Wang, et al., 60% Efficient 10-GHz Power Amplifier with Dynamic Drain Bias Control, IEEE Transactions on Microwave Theory and Techniques, 52(3):1077-1081 (2004).

International Search Report and Written Opinion issued in PCT/US2022/014615, dated Apr. 21, 2022.

International Search Report and Written Opinion issued in PCT/US2021/038529, dated Nov. 10, 2021, in 11 pages.

* cited by examiner

APPARATUS AND METHOD FOR SYNCHRONIZING POWER CIRCUITS WITH COHERENT RF SIGNALS TO FORM A STEERED COMPOSITE RF SIGNAL

CROSS-REFERENCE TO RELATED APPLICATION

This application claims priority to U.S. Provisional Patent Application Ser. No. 62/817,096, filed Mar. 12, 2019, the contents of which are incorporated herein by reference.

FIELD OF THE INVENTION

This invention relates generally to high-power Radio Frequency (RF) signal processing. More particularly, this invention is directed toward techniques for synchronizing power circuits with coherent RF signals to form a steered composite RF signal in a far field.

BACKGROUND OF THE INVENTION

The production of high-power RF signals, such as Megawatts of radiated power, typically requires analog RF signal processing circuitry that consumes large amounts of energy, which results in large amounts of radiated heat. Consequently, expensively rated circuits and elaborate cooling mechanisms are typically required in such systems.

Thus, there is a need to produce high-power RF signals with very low average power, such as under five Killowatts.

SUMMARY OF THE INVENTION

An apparatus has a Radio Frequency (RF) signal generator to produce RF signals phase shifted relative to one another in accordance with RF frequency waveform parameters. Amplifier chains process the RF signals to produce channels of amplified RF signals. Each amplifier chain has amplifiers and at least one amplifier has a tunable gate voltage synchronized with the RF signals.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
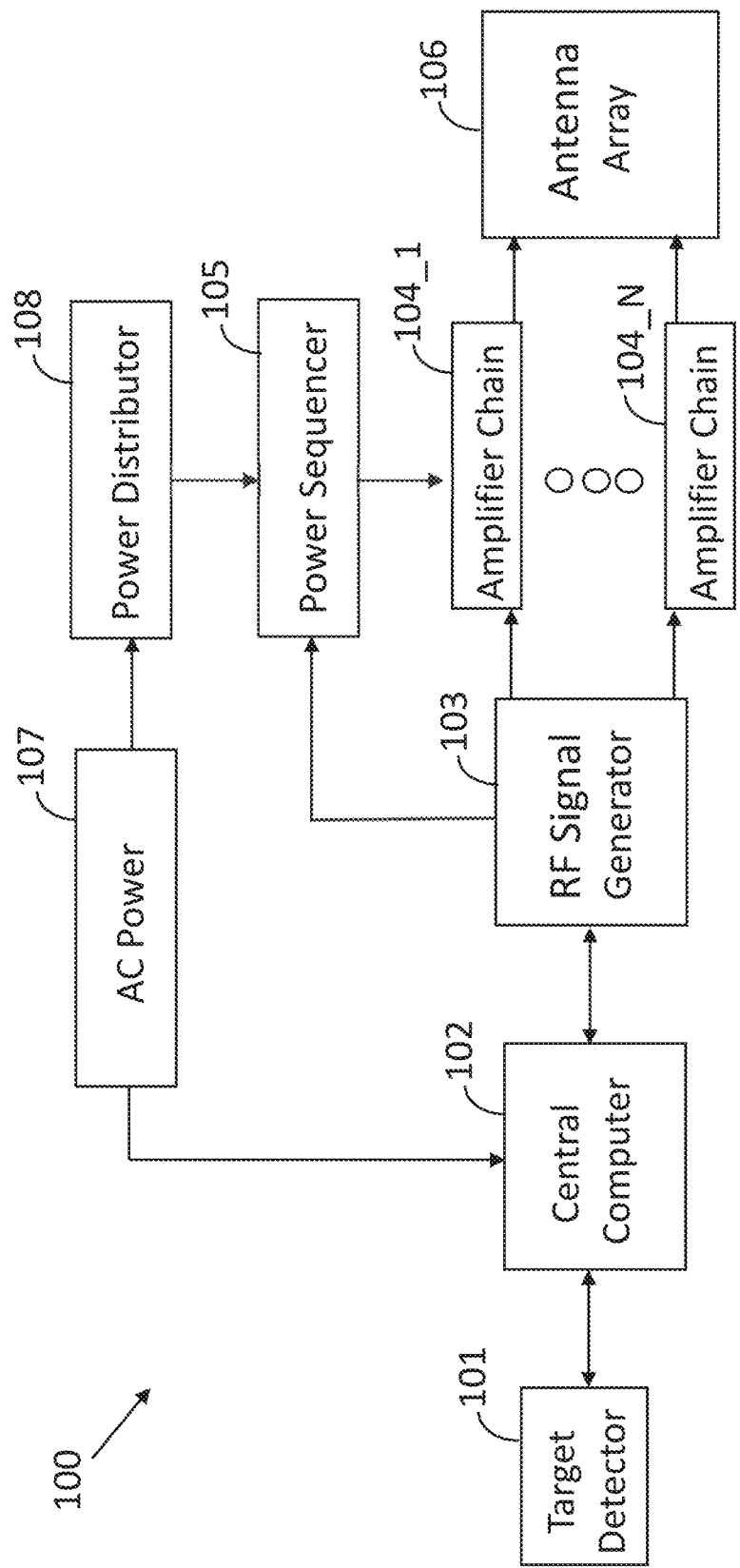
FIG. 1 illustrates a system configured in accordance with an embodiment of the invention.

FIG. 1 illustrates an RF signal generating apparatus 100. The RF signal may be generated in response to a user command entered at a keyboard. In one embodiment, the RF signal is generated in response to the identification of a target by a target detector 101, such as a camera utilizing computer vision algorithms. Consider the case of an unmanned aerial vehicle or drone, the target detector 101 collects a signature characterizing the flight attributes of the drone. The target detector 101 also collects free space parameters associated with the drone, such as azimuth angle, elevation and range. Embodiments of the invention collect this information when the target is 500 to 300 meters from the target detector 101. The signature and free space parameters are passed from the target detector to a central computer 102.

The central computer 102 classifies the target and selects RF waveform parameters, which are passed to an RF signal generator 103. The RF signal generator 103 creates RF signals in accordance with the RF waveform parameters. Each RF signal has a waveform of the frequency, pulse width, pulse repetition interval and intra-pulse modulation specified by the RF waveform parameters received from the central computer 102.

The RF signal generator 103 produces RF signals for multiple channels that are applied to amplifier chains 104_1 through 104_N. The RF signals for the multiple channels are phase shifted relative to one another in accordance with RF frequency waveform parameters. In one embodiment, the phase shifting is digitally performed within the RF signal generator 103. Alternately, analog phase shifters may shift the RF signals prior to applying them to the amplifier chains 104_1 through 104_N.

Each amplifier chain has a serial sequence of solid state power amplifiers, each of which has a gate voltage on set point derived from an automatic calibration operation, as detailed below. Each amplifier chain produces an amplified RF signal. In one embodiment, a mW RF signal from the RF signal generator 103 is amplified to kWs. The amplifier chain may utilize a combination of solid state amplifiers, including silicon laterally-diffused metal-oxide semiconductors, Gallium Nitride, Scandium Aluminum Nitride, GaAs and InP.

The channels of RF signals from the amplifier chains 104_1 through 104_N are applied to an antenna array 106. Each amplifier chain has a corresponding antenna in the antenna array 106. The antenna array 106 broadcasts the channels of RF signals as a steered composite RF signal with Megawatts of radiated power. That is, individual RF signals emitted from different antennae in the antenna array 106 interact in free space to generate a composite RF signal that is directed to a specified location corresponding to the location of the target. The antenna array 106 may include a mechanical gimbal to position individual antennae.

The RF signal generator 103 also sends control signals to the power sequencer 105. The control signals gate amplifiers in the amplifier chains 104_1 through 104_N to produce the channels of RF signals. The control signals ensure that little (e.g., micro to nano amps) leakage or quiescent current is drawn when an RF signal is not being generated. The leakage and quiescent current can be quite large in high power amplifiers circuits if not gated. In one embodiment, the RF signals and power gating signals are turned on and off in 10s of nanoseconds.

The amplified RF signals from the amplifier chains 104_1 through 104_N are applied to an antenna array 106. The phased array RF signals form a steered composite RF signal to disable a target, typically when it is approximately 100 meters from the antenna array 106. The steered composite RF signal has Megawatts of radiated power.

System 100 also includes an AC power source 107 for the different elements of system 100. The AC power source may operate with a power distributor 108, which applies power to the power sequencer 105. In one embodiment, the power distributor 108 converts from AC to DC power. Generally, the conversion from AC to DC can happen either locally at each amplifier or at the system level.

Figure 2:
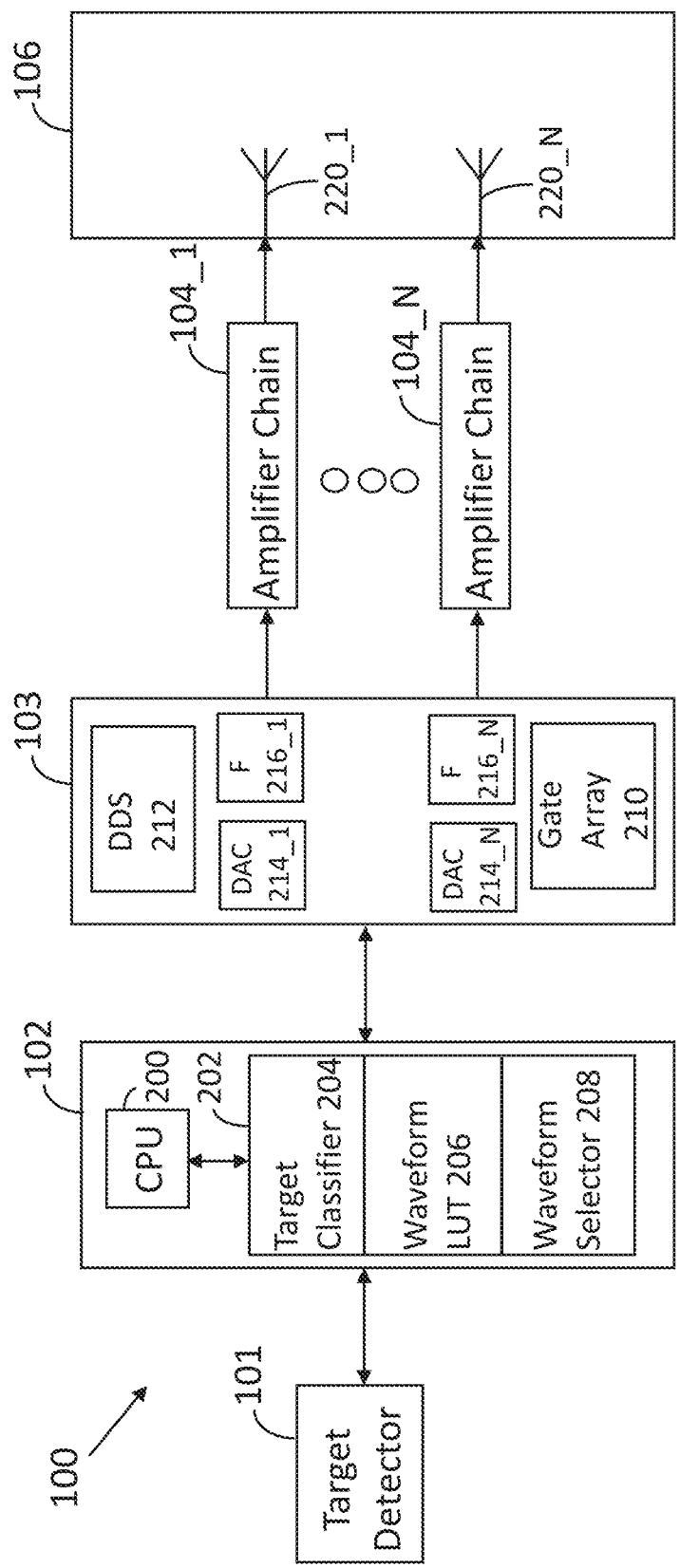
FIG. 2 more fully characterizes components of FIG. 1.

FIG. 2 illustrates details of certain components in system 100. Central computer 102 includes a processor or central processing unit 200 connected to a memory 202. The memory 202 stores instructions executed by processor 200. The instructions include a target classifier 204. In one embodiment, the target classifier 204 matches the signature of the attributes of the target to a waveform in a waveform look-up table 206. The waveform selector 208 designates a waveform to disable the target. The designated waveform also includes free space parameters to insure that the steered composite RF signal intercepts the target. The steered composite RF signal is formed by a collection of phase offset RF signals. The central computer passes RF waveform parameters to the RF signal generator 103.

In one embodiment, the RF signal generator 103 is implemented as an RF system on a Chip Field Programmable Gate array (RFSoC FPGA). The RFSoC FPGA 103 includes a gate array 210 and a direct digital synthesizer 212 that creates waveforms of the frequency, pulse width, pulse repetition interval and intra-pulse modulation specified by the RF frequency waveform parameters generated by the central computer 102. The waveforms are passed to a collection of digital-to-analog (DAC) converters 214_1 through 214_N. Outputs from the DACs 214_1 through 214_N are optionally conditioned by filters 216_1 through 216_N. The filters 216_1 through 216_N may filter the RF signals to a frequency band of interest. The outputs from the RF signal generator 103 are applied to amplifier chains 104_1 through 104_N. Each amplifier chain terminates in an antenna of antenna array 106, such as antennae 220_1 through 220_N.

Figure 3:
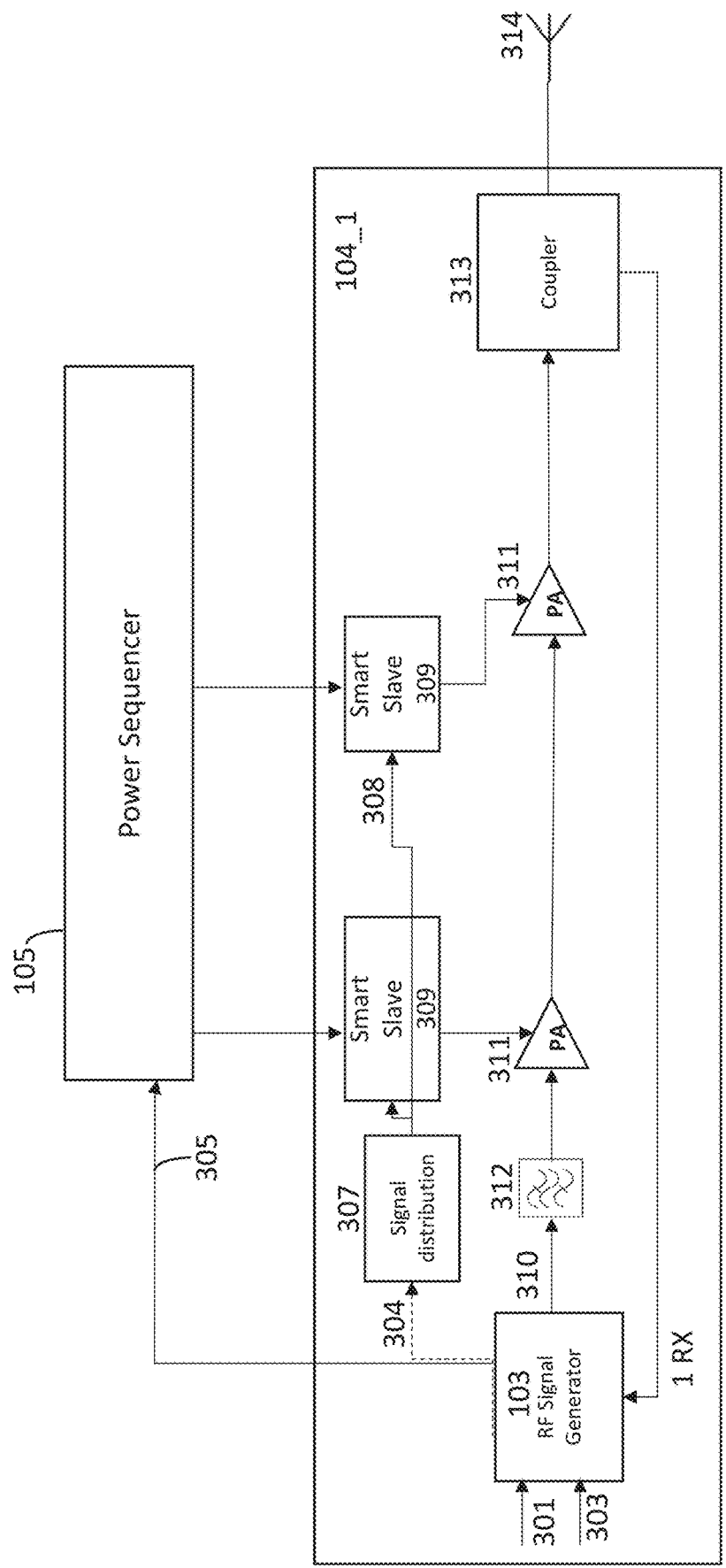
FIG. 3 illustrates a power sequencer utilized in accordance with an embodiment of the invention.

FIG. 3 is a block diagram of different components of FIGS. 1 and 2, including the RF signal generator 103, power sequencer 105, and an amplifier chain 104_1. The RF signal generator 103 receives a control signal from central computer 102 on node 301. A synchronizing clock signal is received on node 303.

A broadcast signal on node 304, an Ethernet signal in one embodiment, is sent to a plurality of power sequencing smart slave units 309. In the one embodiment, the broadcast signal is distributed through a router 307. The broadcast signal initiates a calibration mode in smart slave circuits 509, such that they identify the optimal "on" set point gate voltage for the power amps 311.

The RF signal generator 103 sends a very fast signal with deterministic delay, such as a Low Voltage Differential Signal (LVDS) to power sequencer 105. The power sequencer 105 operates as a master power sequencing gating unit that simultaneously controls smart slave devices 309. In particular, the power sequencer 105 sends a voltage to the slave units 309 and the slave units 309 offset this master voltage with their individual voltage offsets that they established in calibration mode, so that each power amplifier has an optimal gate voltage. Many power amplifiers have different optimal set gate voltages for "on" operation; the disclosed circuits are configured such that each individual power amp 311 has its own set point.

The RF signal generator 103 synchronizes using "on" signals applied to the power sequencers 105. The RF signal generator 103 also applies an RF signal on node 310, which is propagated through power amps 311. The power amp chain may have one or more filters 312. A coupler 313 may be used to allow power levels to be read back to the RF controller 302. More particularly, the feedback includes information on the phase, amplitude, power level and timing of the power amplifiers. This feedback is taken into account to update timing and control algorithms.

The RF signal is amplified through the power amps 311 and is sent to antenna 314. The output from the different antennae of the antenna array 106 form a steered composite RF signal.

Figure 4:
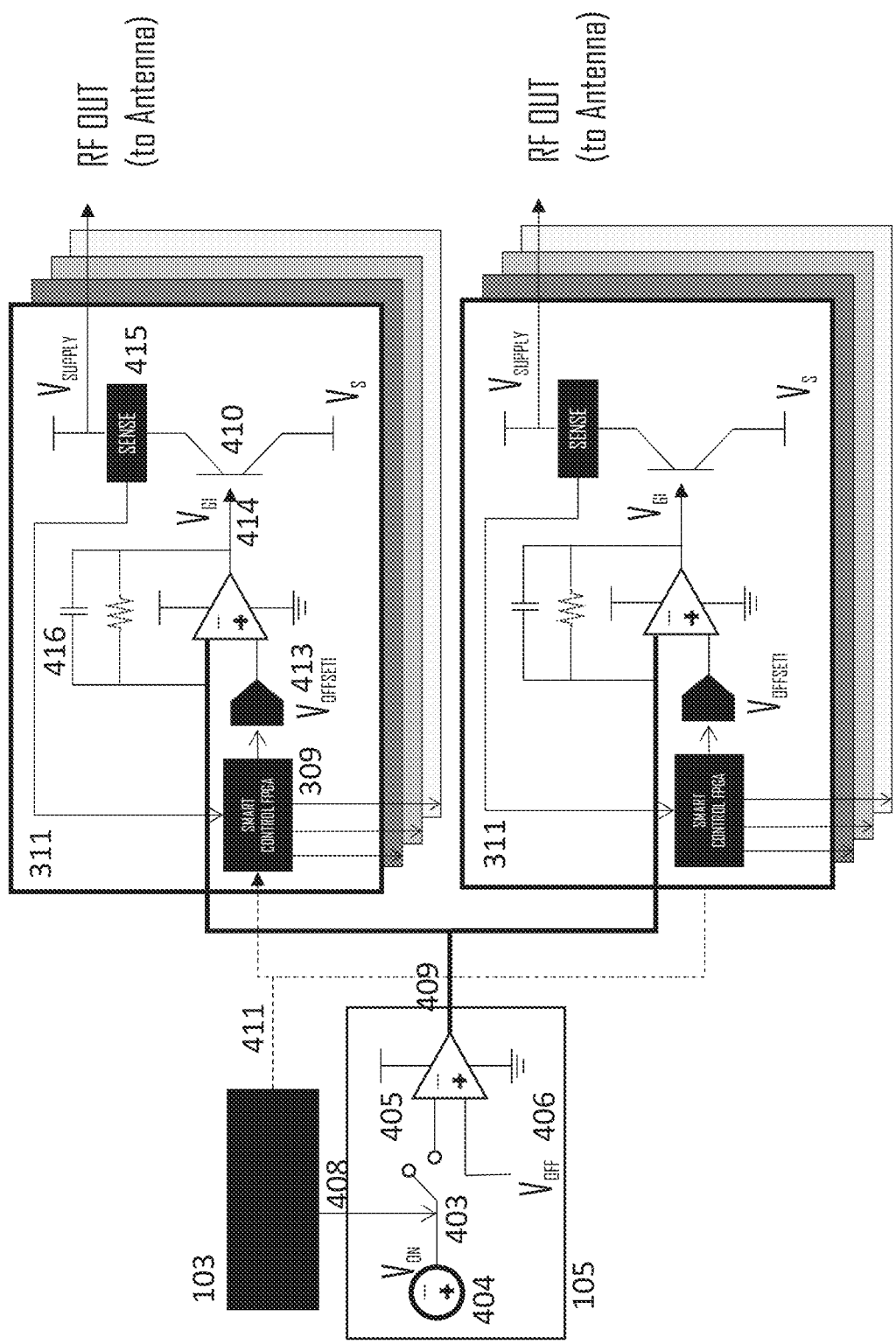
FIG. 4 illustrates power electronics utilized in accordance with an embodiment of the invention.

FIG. 4 illustrates the RF signal generator 103 applying an "on" signal to the power sequencer 105, which operates as a master power gating and sequencing circuit that controls slave power amplifiers 311. In one embodiment, this signal is a Low voltage differential signal (LVDS) that controls a switch 403, which causes current from power supply 404 to flow during an "on" state and stops current flow in "off" state. In one embodiment, the power supply voltage 404 is an offset voltage of about 3 volts, which is added to an off voltage $V_{OFF}$ 406 when the switch 403 is closed. Since the offset voltage $V_{OFF}$ 406 is about −5 volts and the power supply voltage 404 is 3 volts, the output voltage on node 409 is about −2 volts, which is approximately the gate voltage that turns on Gallium Nitride transistors 410. When the switch is open, the output voltage on node 409 defaults back to $V_{OFF}$, which is −5 volts in one embodiment, which is the gate voltage that turns Gallium Nitride transistors off and reduces leakage current down to about 10 microamps.

Node 411 carries a broadcast signal that initiates the auto-calibrate operation of the smart slave circuits 309. In one embodiment, each smart slave circuit 309 is implemented with an FPGA configured to determine the optimal gate voltage set point for turning on a slave amplifier.

Digital to analog converter (DAC) 413 provides an offset voltage that gets added to the master voltage on node 409. This offset voltage is tuned to each individual power amp 410 to provide optimal set point bias voltage $V_{G1}$ on node 414 and maximum power out from the power amp 410. It also enables optimum voltage in the "off" state and minimizes leakage current. The master-slave architecture facilitates fine grained voltage offsets, which is critical to the operation of many transistors, which may be sensitive to gate voltage offsets at the millivolt level. The disclosed technology maximizes voltage offset resolution.

The smart slave 309 controls a plurality of DACs 413 and stores different optimum set points for both the on and off states for each power amp. In the auto-calibration mode, the current sensor 415 is used to feed back a current reading to the smart slave 309. This voltage offset on node 413 is tuned very slightly, by the millivolt in one embodiment, until the current sensed from 415 reaches an optimum current value, as per the data sheets for the power amps 410. This voltage offset is stored. This process is repeated to minimize the current in "off" state. The current can also be sensed during active operation to determine the viability of the power amp. If the current starts to degrade or change or significantly decrease, this can indicate that the amplifier is damaged and needs to be replaced, or can indicate that the temperature is out of range for optimal operation.

The capacitor 416 can be tuned to change the rise and fall time for the gate bias signal on node 414. In some embodiments, capacitor 416 is real time programmable by the smart control FPGA 309, such as by a series of switches, to include more or less capacitance in the feedback path 416. This is important because different power amps 410 each have a different gate capacitance. Capacitor 416 is tuned based on the gate capacitance for optimal operation. Tuning capacitor 416 affects how fast or slow the rise time is on the gate voltage at node 414, this effects speed and efficiency of the power gating. Changing the charge on capacitor 416 can also change the amount of time the power amp rings or oscillates. In other embodiments, capacitor 416 is configured to tune the rise and fall time for very fast operation.

Figure 5:
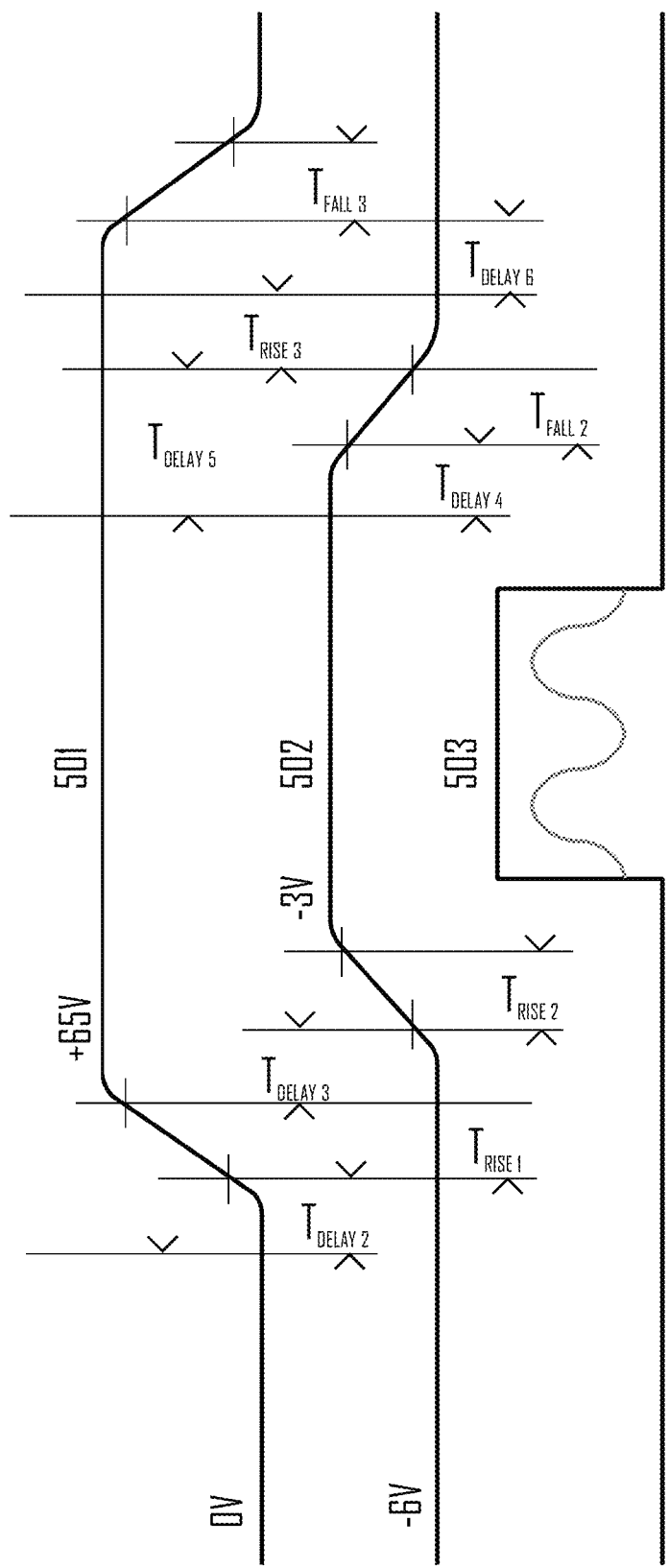
FIG. 5 illustrates power electronics control signals utilized in accordance with an embodiment of the invention.

FIG. 5 illustrates waveforms that may be used in conjunction with the circuitry of FIG. 4. The supply voltage 501 ($V_{SUPPLY}$ in FIG. 4) to the power amp (410 in FIG. 4) is turned on first. Alternately, it may be left on all the time. The gate voltage waveform 502 is applied to node 414 of FIG. 4. Then, the RF signal from RF signal generator 103 is applied to node 414. This example is for a 65 Volt Gallium Nitride (GaN) solid state power amplifier, but the principle may generally apply to any solid state power amplifier. The drain voltage 501 toggles from 0 Volts to 65 Volts. Then, the source current is tuned from −5 Volts to −2 Volts, where it is considered "open" and the transistor is "on" so that a quiescent current starts to flow. Finally, the RF input signal 503 is applied and the transistor draws active power once the RF power is on, in some embodiments up to 30 amps of current create 1,500 watts of power out of the transistor 410.

The RF signal 503 is sent out as a short pulse, for example, as short as 10 ns or as long as milliseconds. The length of the pulse depends on the type of target. After the RF pulse is complete, the source voltage is pinched off back down to −6 Volts, and then shortly after the drain voltage is tuned from 65 Volts down to 0 Volts and the transistor is off and therefore draws minimal current.

Figure 6:
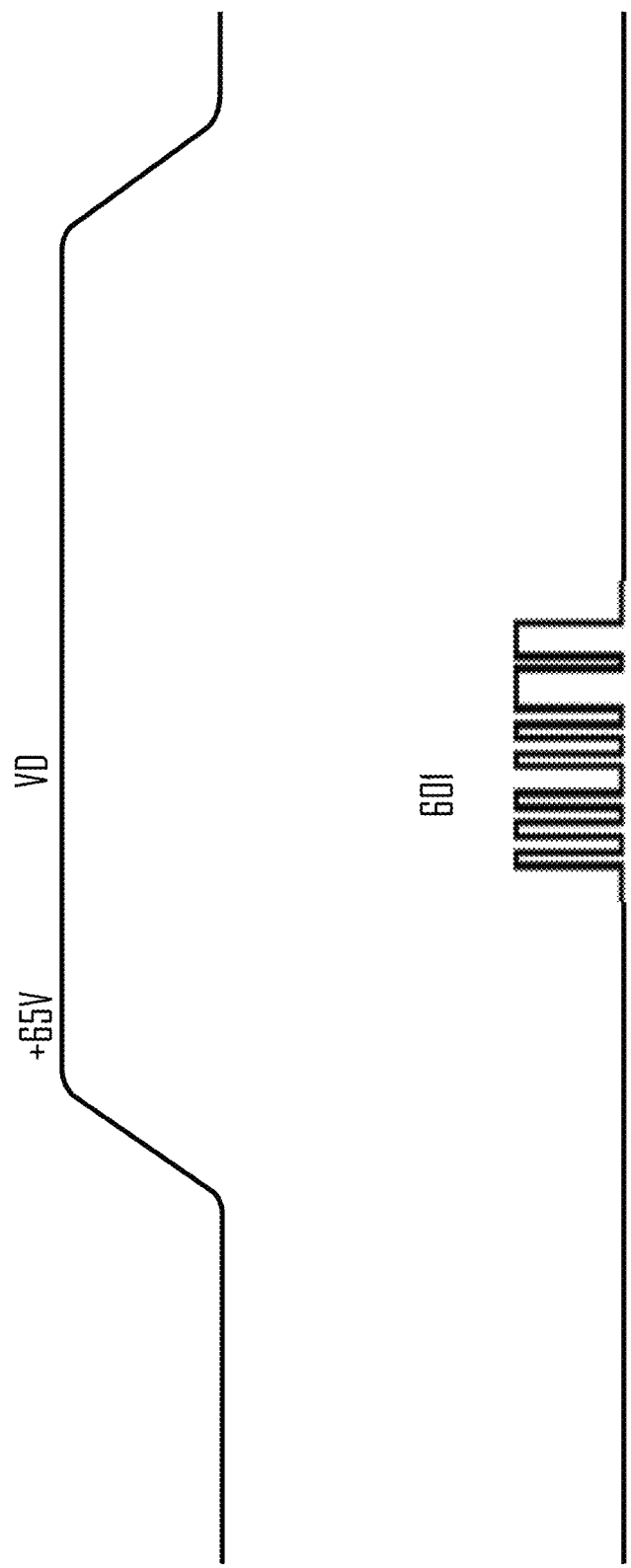
FIG. 6 illustrates an RF signal utilized in accordance with an embodiment of the invention.

FIG. 6 illustrates a timing diagram showing a non-linear pulse train 601 with uneven pulses. The pulse train 801 is sent through power amp 410, where the RF and voltage bias is turned on and off very quickly (e.g., 10s of nanoseconds). In one embodiment, the pulses are in an arbitrary pattern at a frequency of 1 GHz.

Figure 7:
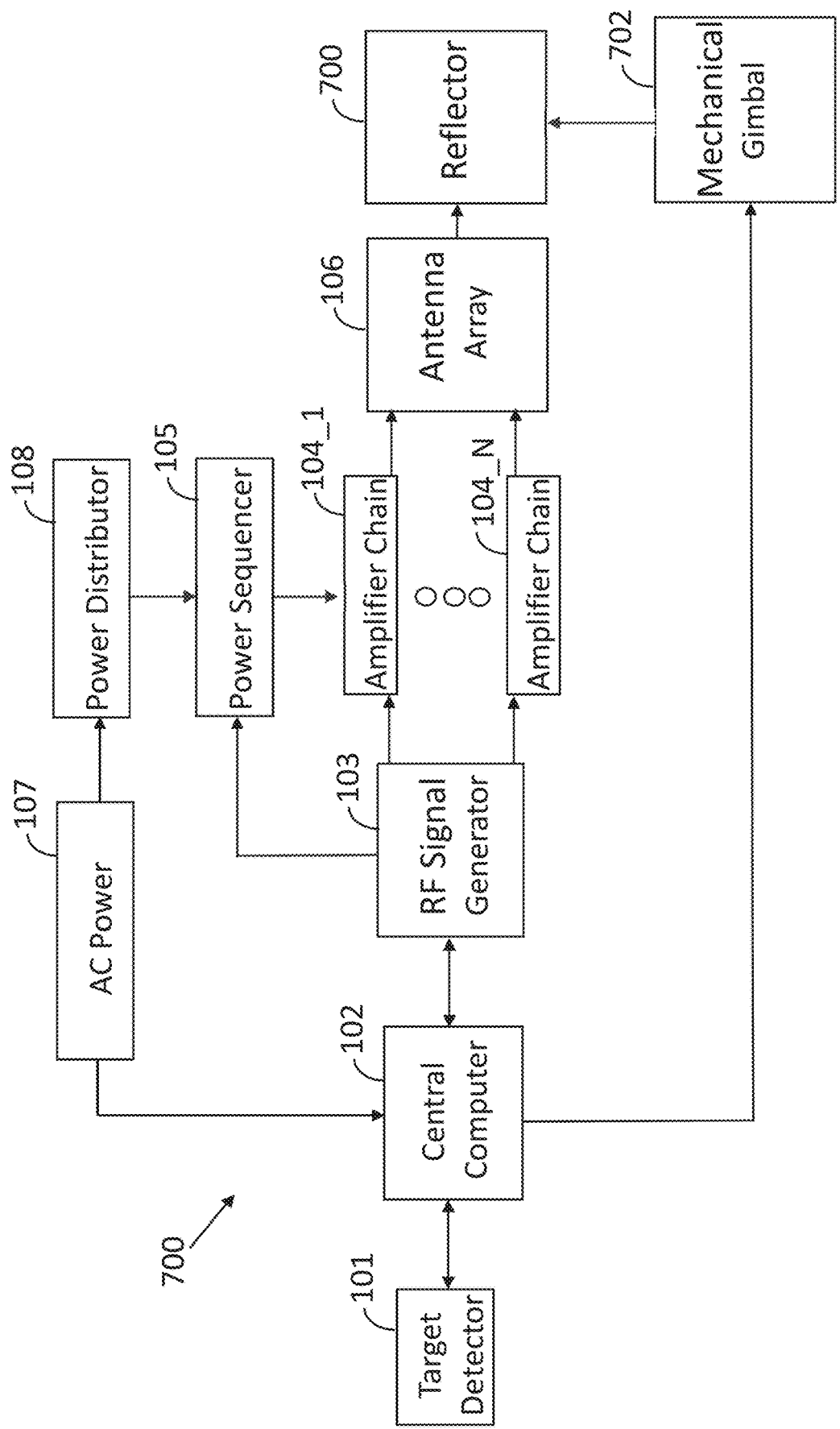
FIG. 7 illustrates the system of FIG. 1 utilizing a reflector and mechanical gimbal 702.

FIG. 7 illustrates a system 700 corresponding the system 100 of FIG. 1. However, in this embodiment, the antenna array 106 transmits its RF power signal to a reflector 700. For example, 16 antennae operating at the L-band frequency with half-wavelength spacing may transmit into a 3 meter reflector dish. The reflector dish may have a subreflector. A mechanical gimbal 702 may control the position of the reflector 700 in response to control signals from central computer 102.

The 3 meter reflector dish provides 28.1 dBi, or 645× linear magnification of the energy. In one embodiment, the reflector dish is fed by a 16 element phased array antenna in a 4×4 array. At a 1% duty cycle and 70% power efficiency, the power system only requires 550 watts of DC power output, enabling a small power supply.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. An apparatus, comprising:
   a Radio Frequency (RF) signal generator configured to produce a plurality of RF signals phase shifted relative to one another in accordance with RF waveform parameters; and
   a plurality of amplifier chains configured to process the plurality of RF signals to produce a plurality of channels of amplified RF signals, wherein each amplifier chain includes a plurality of solid state amplifiers each of which has a tunable gate voltage that turns on or off a respective amplifier, and wherein the tunable gate voltage is derived from an automatic calibration operation that utilizes a feedback of a current flowing in a drain of the respective amplifier.

2. The apparatus of claim 1 wherein the respective amplifier is connected to a capacitor that is tuned to adjust a respective tunable gate voltage of the respective amplifier.

3. The apparatus of claim 1 wherein the respective amplifier is connected to a current sensor configured to sense the current flowing in the drain of the respective amplifier.

4. The apparatus of claim 1 further comprising a central computer configured to produce the RF waveform parameters.

5. The apparatus of claim 4 further comprising an antenna array configured to broadcast the plurality of channels of amplified RF signals as a steered composite RF signal with Megawatts of radiated power.

6. The apparatus of claim 5 wherein the steered composite RF signal is pulsed for less than 1 millisecond.

7. The apparatus of claim 5 wherein the steered composite RF signal has a frequency of approximately 1 GHz.

8. The apparatus of claim 4 wherein the central computer includes a processor and a memory storing a target classifier with instructions executed by the processor to classify a target based upon flight attributes of the target.

9. The apparatus of claim 8 wherein the central computer includes a waveform selector stored in the memory, the waveform selector configured to select the RF waveform parameters from a waveform look-up table.

10. The apparatus of claim 1 wherein the RF signal generator is an RF system on a Chip Field Programmable Gate Array.

11. The apparatus of claim 1 wherein the RF signal generator produces digital RF signals that are applied to digital-to-analog converters.

12. The apparatus of claim 1 further comprising a power sequencer controlled by the RF signal generator.

13. The apparatus of claim 12 wherein the power sequencer is configured as a master power sequencing gating unit.

14. The apparatus of claim 13 further comprising smart slave circuits controlled by the power sequencer, wherein the smart slave circuits coordinate the automatic calibration operation.

15. The apparatus of claim 1 further comprising a reflector dish configured to process the plurality of channels of amplified RF signals.

16. The apparatus of claim 15 further comprising a mechanical gimbal configured to orient a position of the reflector dish.

17. The apparatus of claim 1 in combination with a target detector.

18. The apparatus of claim 1 wherein the tunable gate voltage comprises a first tunable gate voltage that turns on the respective amplifier, and wherein the first tunable gate voltage is derived based on determining that the feedback of the current flowing in the drain of the respective amplifier satisfies a threshold current value associated with a maximum power output of the respective amplifier.

19. The apparatus of claim 18 wherein the tunable gate voltage comprises a second tunable gate voltage that turns off the respective amplifier, and wherein the second tunable gate voltage is derived based on determining that the feedback of the current flowing in the drain of the respective amplifier satisfies a threshold current value associated with a minimal leakage current.

20. The apparatus of claim 1 wherein the feedback of the current flowing in the drain of the respective amplifier is utilized to determine that the respective amplifier is damaged or that a temperature of operation is out of range of optimal operation.

21. The apparatus of claim 1 wherein the respective amplifier is configured to turn on synchronously with a start of a pulse of an RF signal of the plurality of RF signals and turn off synchronously with an end of the pulse of the RF signal.

22. The apparatus of claim 1 wherein the tunable gate voltage of the respective amplifier is configured to be adjusted using a voltage offset derived from the automatic calibration operation and applied to a gate of the respective amplifier.

23. The apparatus of claim 22 wherein the voltage offset is adjusted on a scale of a millivolt, during the automatic calibration operation.

24. The apparatus of claim 1 further comprising a memory configured to store a value corresponding to the tunable gate voltage.

25. The apparatus of claim 1 wherein the plurality of solid state amplifiers comprise Gallium Nitride.

\* \* \* \* \*